(12) United States Patent
Yamashita et al.

(10) Patent No.: US 8,530,943 B2
(45) Date of Patent: Sep. 10, 2013

(54) SEMICONDUCTOR DEVICE

(75) Inventors: Kenya Yamashita, Hyogo (JP); Chiaki Kudou, Hyogo (JP)

(73) Assignee: Panasonic Corporation, Osaka (JP)

( * ) Notice: Subject to any disclaimer, the term of this patent is extended or adjusted under 35 U.S.C. 154(b) by 231 days.

(21) Appl. No.: 12/997,958

(22) PCT Filed: Aug. 20, 2009

(86) PCT No.: PCT/JP2009/003990
§ 371 (c)(1),
(2), (4) Date: Dec. 14, 2010

(87) PCT Pub. No.: WO2010/021146
PCT Pub. Date: Feb. 25, 2010

(65) Prior Publication Data
US 2011/0095305 A1   Apr. 28, 2011

(30) Foreign Application Priority Data
Aug. 21, 2008   (JP) .................................. 2008-212854

(51) Int. Cl.
*H01L 29/66*   (2006.01)

(52) U.S. Cl.
USPC ...... 257/285; 257/77; 257/390; 257/E29.025; 257/E29.104

(58) Field of Classification Search
USPC .................... 257/77, 390, E29.104, 135, 285, 257/E29.012, E29.025
See application file for complete search history.

(56) References Cited

U.S. PATENT DOCUMENTS

| | | | |
|---|---|---|---|
| 5,016,066 A * | 5/1991 | Takahashi | ..................... 257/339 |
| 5,621,234 A | 4/1997 | Kato | |
| 2004/0119076 A1 | 6/2004 | Ryu | |
| 2010/0219417 A1 | 9/2010 | Miura et al. | |

FOREIGN PATENT DOCUMENTS

| | | |
|---|---|---|
| JP | 64-039069 A | 2/1989 |
| JP | 03-034466 A | 2/1991 |
| JP | 05-299658 A | 11/1993 |

(Continued)

OTHER PUBLICATIONS

International Search Report for corresponding International Application No. PCT/JP2009/003990 mailed Oct. 20, 2009.

(Continued)

*Primary Examiner* — Matthew Landau
*Assistant Examiner* — Joseph C Nicely
(74) *Attorney, Agent, or Firm* — Renner, Otto, Boisselle & Sklar, LLP

(57) ABSTRACT

The semiconductor device includes: a substrate 2 and a drift layer 3a, which are made of a wide-bandgap semiconductor; a p-type well 4a and a first n-type doped region 5, which are defined in the drift layer; a source electrode 5, which is electrically connected to the first n-type doped region 5; a second n-type doped region 30 arranged between its own well 4a and an adjacent unit cell's well 4a; a gate insulating film 7b, which covers at least partially the first and second n-type doped regions and the well 4a; a gate electrode 8 arranged on the gate insulating film; and a third n-type doped region 31, which is arranged adjacent to the second n-type doped region so as to cover one of the vertices of the unit cell and which has a dopant concentration that is higher than the drift layer and lower than the second n-type doped region.

14 Claims, 7 Drawing Sheets

(56) References Cited

FOREIGN PATENT DOCUMENTS

| JP | 2002270839 A | * | 9/2002 |
| --- | --- | --- | --- |
| JP | 2005-005578 A | | 1/2005 |
| JP | 2005-136166 A | | 5/2005 |
| JP | 2006-019608 A | | 1/2006 |
| JP | 2006-511961 | | 4/2006 |
| JP | 2006-303323 A | | 11/2006 |
| JP | 2007-005398 A | | 1/2007 |
| WO | 2007/091360 A1 | | 8/2007 |

OTHER PUBLICATIONS

Form PCT/ISA/237 for International Application No. PCT/JP2009/003990 dated Oct. 20, 2009.

IPRP for International Application No. PCT/JP2009/003990 dated May 25, 2010.

* cited by examiner

SEMICONDUCTOR DEVICE

TECHNICAL FIELD

The present invention relates to a semiconductor device and more particularly relates to a silicon carbide (SiC) metal-oxide-semiconductor field effect transistor (MOSFET).

BACKGROUND ART

A vertical SiC power MOSFET is expected to be a device that will have a higher breakdown voltage, and be driven with a greater amount of current, than a vertical Si power device. Hereinafter, the structure of a conventional vertical SiC power MOSFET will be described with reference to FIG. 7, which schematically illustrates a cross section of such a conventional MOSFET in one direction (i.e., x direction in this case). It should be noted that the SiC power MOSFET also has the same structure in the direction coming out of the paper of FIG. 7 (i.e., in the y direction). And a number of unit cells, each having the structure surrounded with the one-dot chains, are arranged two-dimensionally in the x and y directions.

Each unit cell U includes a semiconductor substrate 102 of SiC (which will be sometimes referred to herein as an "SiC substrate") and a n-type drift layer 103, which is arranged on the SiC substrate 102. A p-type well 104a has been defined in the drift layer 103 so as to spread inward from the surface 103s. Inside the well 104a, further defined are an n-type source region 105 and a p-type contact region 104b, which make ohmic contact with a source electrode 106 arranged on the surface 103s of the drift layer 103. A gate insulating film 107a has been deposited so as to cover not only portions of the well 104a that would otherwise be exposed on the surface 103s of the drift layer 103 but also the surface region of the drift layer 103 without the well 104a. And a gate electrode 108 is arranged on the gate insulating film 107a. On the other side of the SiC substrate 102, a drain electrode 101 is arranged opposite to the drift layer 103 and makes ohmic contact with the semiconductor substrate 102.

In such a unit cell U of the vertical SiC power MOSFET, if a voltage is applied to the gate electrode 108, an inversion layer to be a channel will be produced in a region of the well 104a, which is located under the gate electrode 108 and in the vicinity of the interface with the gate insulating film 107a. As a result, as indicated by the dashed lines, the electrons that have been injected from the source electrode 106 pass through the inversion layer in the well 104a, the drift layer 103 in its thickness direction and then through the SiC substrate 102 to reach the drain electrode 101 eventually. That is why the amount of current flowing between the drain electrode 101 and the source electrode 106 can be controlled according to the voltage applied to the gate electrode 108.

As described above, the unit cell U has the same structure in the y direction that comes out of the paper. That is why when viewed perpendicularly to the surface 103s of the drift layer 103, the well 104a has a rectangular shape. FIG. 8 is a perspective view schematically illustrating the arrangement of those unit cells U in the SiC power MOSFET 100. In FIG. 8, adjacent unit cells U are illustrated as if they were amply spaced from each other in order to allow the reader to see the cells more easily. Also, in FIG. 8, only the respective wells 104a of the unit cells U are shown and the flow of electrons is indicated by the dotted arrows.

As already described with reference to FIG. 7, in each unit cell U of the SiC power MOSFET 100, the electrons will move from the surface 103s of the drift layer 103 in the thickness direction of the SiC substrate 102 in the vicinity of the boundary with the adjacent unit cells U. That is why in the vertical SiC power MOSFET 100 as a whole, the electrons will move between the wells 104a in the thickness direction of the drift layer 103 and the SiC substrate 102. This "vertical" MOSFET is called as such because the source electrode 106 and the drain electrode 101 are spaced apart from each other in the thickness direction of the drift layer 103 and the SiC substrate 102 and because electrons, which are one type of carriers, move in that thickness direction.

In each unit cell U of the vertical SiC power MOSFET 100, the channel is produced around the outer periphery of the rectangular well 104a. That is why on the surface 103s of the drift layer 103, the sum of the lengths of the four sides that define the well 104a becomes the gate width. In the vertical SiC power MOSFET 100 with such a structure, the smaller the unit cell U, the longer the total gate width will be.

As shown in FIG. 9, if each side of the unit cell U1 has a length W, then the total gate width will be 4W. On the other hand, supposing each unit cell U2 has a length of W/2 each side, four unit cells U2 can be formed within the area of one unit cell U1. And as each unit cell U2 has a gate width of 2W, the total gate width will be 8W. That is why by reducing the size of the unit cells, the amount of current flowing per unit area, i.e., the current density, can be increased.

For that reason, people have attempted to make as small a unit cell as possible in the vertical SiC power MOSFET. However, as the source electrode 105 and the contact region 104b should be defined within the well 104a as shown in FIG. 7, the well 104a cannot be reduced too indefinitely to define those regions reasonably accurately. That is why it is now an important problem to solve in the field of vertical SiC power MOSFETs how in the world to shorten the interval L between the wells 104a.

On the other hand, to drive the vertical SiC power MOSFET with as large an amount of current as possible, it is no less important to reduce the ON-state resistance. Generally speaking, in the vertical SiC power MOSFET, its ON-state resistance is calculated as the sum of source contact resistance, source sheet resistance, channel resistance, JFET resistance, drift resistance, substrate resistance and drain contact resistance. Among these various kinds of resistance, the key point is to reduce the channel resistance and the JFET resistance effectively.

As used herein, the "channel resistance" refers to the resistance of the channel to be produced under the gate insulating film 107a. According to conventional SiC-MOSFET related technologies, until just recently, the channel mobility has been low and the channel resistance has been high due to the property of the SiC material itself and owing to some difficulties with its manufacturing process. Nevertheless, as technologies for forming an oxide film have been tremendously developed these past years, it is now possible to achieve a channel mobility of approximately 30-60 cm$^2$/Vs even on a (0001) plane of 4H—SiC. Thus, the present inventors confirmed via experiments that if the channel length was set to be 1 μm or less in a SiC power MOSFET with a unit cell size of 10 μm or less, the channel resistance could be reduced to the range of approximately 1.5 to 2.0 mΩcm$^2$.

On the other hand, the "JFET resistance" refers to the resistance of the JFET region 111 that is interposed between two adjacent wells 104a of the drift layer 103, which provides passage for electrons that move from the source to the drain as shown in FIG. 7. As there is a pn junction between the p-type well 104a and the n-type drift layer 103, a depletion layer 110 is formed there, thus narrowing the current path and eventually increasing the resistance of the JFET region 111.

If the drift layer 103 has a normal dopant concentration of approximately $5 \times 10^{15}$ cm$^{-3}$, then the depletion layer 110 will expand when the MOSFET is turned ON. In that case, to prevent the depletion layer 110 from pinching off the path of the electrons that are moving through the JFET region 111, the interval L should be at least equal to 3 µm. Even so, however, the JFET resistance would still be relatively high.

As a result, the unit cell U comes to have an increased size and a decreased channel density, and eventually, the SiC power MOSFET will have an increased channel resistance overall. On top of that, the source contact region will account for a much smaller percentage of the overall area, and therefore, the source contact resistance will increase, which is not beneficial, either. Consequently, it is difficult to reduce the ON-state resistance of the SiC power MOSFET effectively.

In order to overcome these problems, Patent Document No. 1 discloses a technique for minimizing the expansion of the depletion layer by increasing the carrier density in the JFET region 111 to the range of approximately $1 \times 10^{16}$ cm$^{-3}$ to $5 \times 10^{17}$ cm$^{-3}$. According to Patent Document No. 1, even if the concentration in the JFET region 111 is different from, but higher than, in any other region in the drift layer, the ON-state characteristic of the SiC power MOSFET should still be improvable.

CITATION LIST

Patent Literature

Patent Document No. 1: PCT International Application Japanese National Phase Publication No. 2006-511961

SUMMARY OF INVENTION

Technical Problem

If the dopant concentration in the JFET region 111 is increased and if the interval L between the wells 104a is shortened, then the size of the unit cells can be reduced and the channel resistance can be further decreased. That is why the shorter the interval L, the more effectively the ON-state resistance of the SiC power MOSFET should be reduced. Although it is necessary to take the upper limit of the carrier density of the semiconductor and the tolerance of the semiconductor device manufacturing process into consideration, the interval L could be as close to zero µm as possible, theoretically speaking.

The present inventors actually modeled such devices with the dopant concentration increased in the JFET region 111 and with the interval L decreased, and subjected them to various experiments. As a result, we confirmed that the JFET resistance could be reduced when the MOSFET was ON. However, we also discovered that when the MOSFET was turned ON (i.e., when a high voltage was applied to the drain electrode), an increased amount of leakage current flowed through the gate insulating film or the gate insulating film even ruptured due to an increase in the amount of drain leakage current, a decrease in source-drain breakdown voltage and a high drain electric field.

It is therefore an object of the present invention to provide a semiconductor device that can still have low ON-state resistance and a reasonably high degree of reliability in its OFF state even if the size of the unit cell is reduced.

Solution to Problem

A semiconductor device according to the present invention has multiple unit cells that are arranged either one-dimensionally or multi-dimensionally. Each unit cell includes: a substrate, which is made of a wide-bandgap semiconductor; an n-type drift layer, which is arranged on the substrate and which is made of the wide-bandgap semiconductor; a p-type well, which is defined in the drift layer; a first n-type doped region, which is defined in the well; a source electrode, which is electrically connected to the first n-type doped region; a second n-type doped region, which is defined in the drift layer and arranged between its own well and an adjacent unit cell's well and which has a higher dopant concentration than the drift layer; a gate insulating film, which covers at least partially the first and second n-type doped regions and the well; a gate electrode, which is arranged on the gate insulating film; and a third n-type doped region, which is defined in the drift layer and arranged adjacent to the second n-type doped region so as to cover one of the vertices of the unit cell when the drift layer is viewed perpendicularly to the surface of the drift layer in the thickness direction thereof and which has a lower dopant concentration than the second n-type doped region.

In one preferred embodiment, each unit cell further includes a drain electrode, which is arranged on the other side of the substrate opposite to the drift layer. A voltage with such a polarity as to maintain a high breakdown voltage is applied to the drain electrode. And the dopant concentration of the third n-type doped region is defined so that the third n-type doped region starts to be depleted before the second n-type doped region gets depleted completely.

In another preferred embodiment, if the minimum interval between the well of each said unit cell and the well of the adjacent unit cell is a, then the third n-type doped region is located at a distance exceeding a/2 from the outer periphery of the former well.

In still another preferred embodiment, the unit cells are arranged two-dimensionally.

In a specific preferred embodiment, if the drift layer is viewed perpendicularly to its surface in the thickness direction thereof, those unit cells have a square shape and are arranged in a hound's-tooth check.

In an alternative preferred embodiment, if the drift layer is viewed perpendicularly to its surface in the thickness direction thereof, those unit cells have a square shape and are arranged in a checkerboard pattern.

In another preferred embodiment, if the drift layer is viewed perpendicularly to its surface in the thickness direction thereof, those unit cells have a hexagonal shape and are arranged so that three adjacent unit cells share their vertices with each other.

In a specific preferred embodiment, if the drift layer is viewed perpendicularly to its surface in the thickness direction thereof, the second n-type doped region is arranged adjacent to the well only where the boundaries defining the respective wells of each unit cell and its adjacent unit cell are substantially parallel to each other, and the third n-type doped region is arranged so as to fill a different part of the gap between the wells of the two adjacent unit cells other than the second n-type doped regions.

In yet another preferred embodiment, each unit cell further includes a channel layer, which is arranged under the gate insulating film so as to cover at least partially the first and second n-type doped regions and the well.

In a specific preferred embodiment, the wide-bandgap semiconductor is SiC.

In another specific preferred embodiment, the third n-type doped region has a dopant concentration that is less than $1 \times 10^{17}$ cm$^{-3}$.

Advantageous Effects of Invention

According to the present invention, the third n-type doped region, which has a lower dopant concentration than the second n-type doped region arranged between adjacent wells, is arranged to cover a vertex of the unit cell. Thus, even when the semiconductor device is in OFF state and when the drain electrode is at a high potential level, the concentration of electric field around the vertex of the unit cell can be reduced, the amount of drain leakage current to flow can be decreased, and the variation in breakdown voltage from one semiconductor device to another can be minimized. On top of that, as the intensity of the electric field applied to the gate insulating film can be reduced at the vertex of the unit cell, the rupture of the gate insulating film can be avoided, and its reliability can be increased, too.

What is more, as some current flows through the third n-type doped region when the semiconductor device is in ON-state, the ON-state resistance of the semiconductor device can be reduced without diminishing the effect of reducing the JFET resistance between the wells. As a result, not only the interval between the wells but also the size of the unit cell can be reduced, and therefore, a semiconductor device that can be driven with a huge amount of current is provided.

DESCRIPTION OF EMBODIMENTS

As described above, the present inventors discovered that in the conventional SiC power MOSFET, if the concentration in the JFET region was increased and if the interval between the wells was shortened, the drain leakage current increased, the source-drain breakdown voltage decreased, and the gate insulating film either produced a significantly increased amount of leakage current or even ruptured. We carried out extensive researches to find out how and why these phenomena happened. As a result, we discovered that all of these phenomena took place for the same cause. Hereinafter, that cause will be described in detail.

Figure 7:
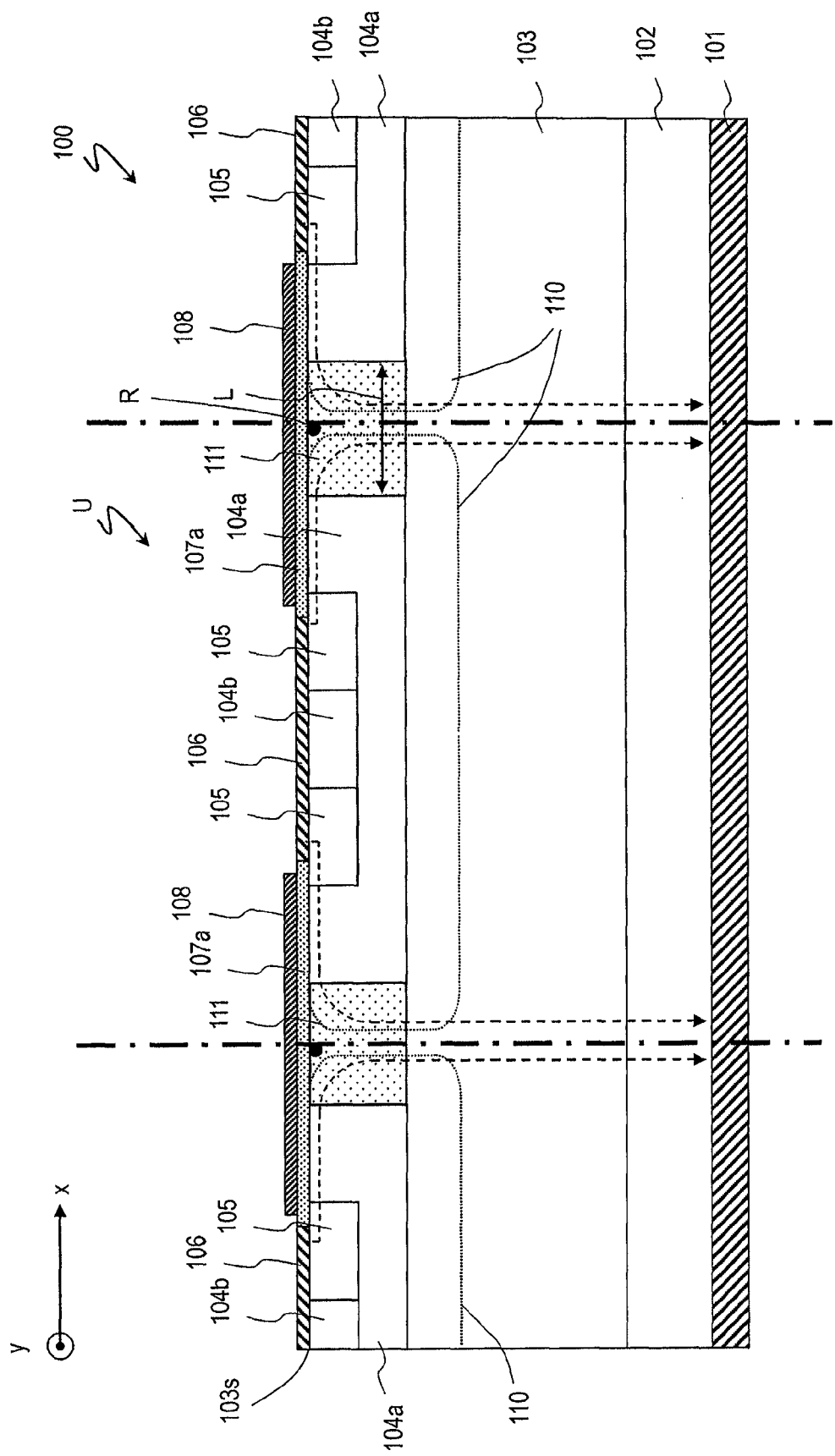
FIG. 7 is a cross-sectional view illustrating the structure of a conventional SiC power MOSFET.
Figure 8:
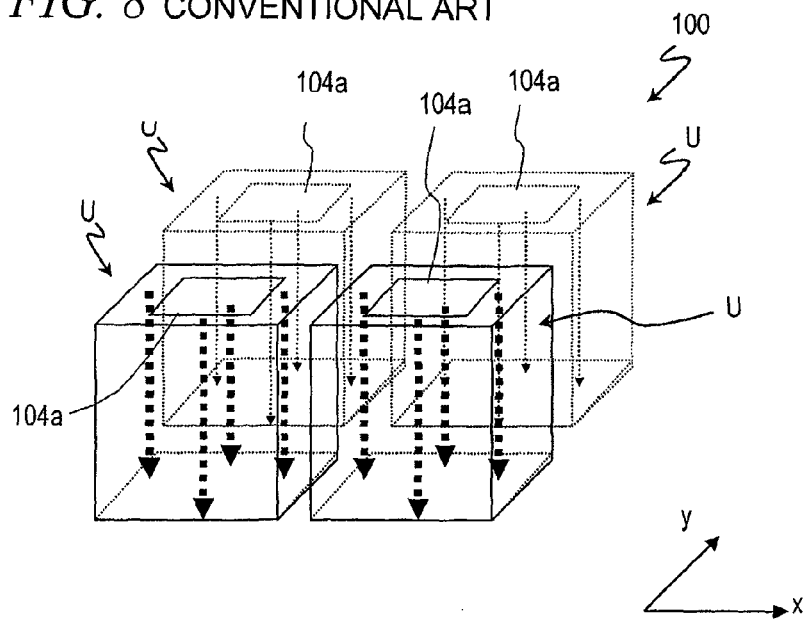
FIG. 8 is a schematic representation illustrating an exemplary arrangement of unit cells in a conventional SiC power MOSFET.
Figure 9:
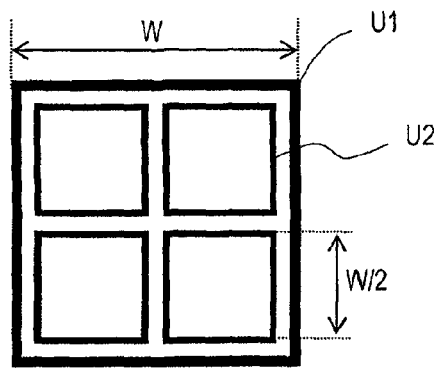
FIG. 9 is a plan view illustrating the structure of a conventional Si power MOSFET.

As shown in FIG. 7, when the SiC power MOSFET 100 is in OFF state, there is a huge potential difference between the gate electrode 108 and the drain electrode 101. In that case, a depletion layer 110 will be produced in the JFET region 111, and therefore, the electric field, which has been generated due to the potential difference between the gate electrode 108 and the drain electrode 101, will be concentrated to where the depletion layer 110 is absent. More specifically, a point R, which is located within the JFET region 111 at a substantially equal distance from any of the two adjacent wells 104a, is most distant from the interface between the well 104a and the drift layer 103, and therefore, the depletion layer 110 is least likely produced there. For that reason, when the MOSFET is OFF, the electric field will be concentrated toward the point R within the JFET region 111.

Figure 10:
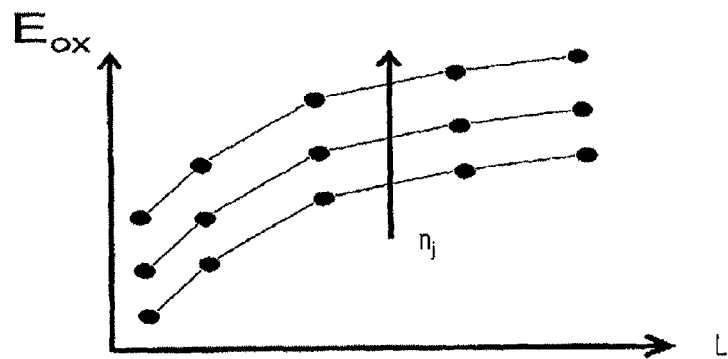
FIG. 10 is a graph showing how the intensity of the electric field applied to the gate insulating film varies with the interval between the wells and the dopant concentration in the JFET region.

If the dopant concentration in the JFET region 111 is increased, the ON-state resistance can be reduced. But even in the OFF state, the dopant added will also lower the resistance in the JFET region 111 and will raise the voltage applied to the gate insulating film, too. Also, if the interval L between the wells 104a increases, the depletion layer will less likely reach the vicinity of the center of the JFET region 111, and therefore, the voltage at the point R rises in the OFF state. FIG. 10 is a graph showing how the intensity of the electric field applied to the gate insulating film 107a varies in the OFF state with the interval L between the wells 104a and the concentration $n_j$ at the point R in the JFET region. As can be seen easily from FIG. 10, the longer the interval L and the higher the concentration $n_j$ in the JFET region, the more intense the electric field applied to the gate insulating film. That is why as long as the highest electric field intensity at the point R is adequate enough to ensure long term reliability for the gate insulating film, the sizes and dopant concentrations of respective elements within each unit cell are determined.

Figure 11:
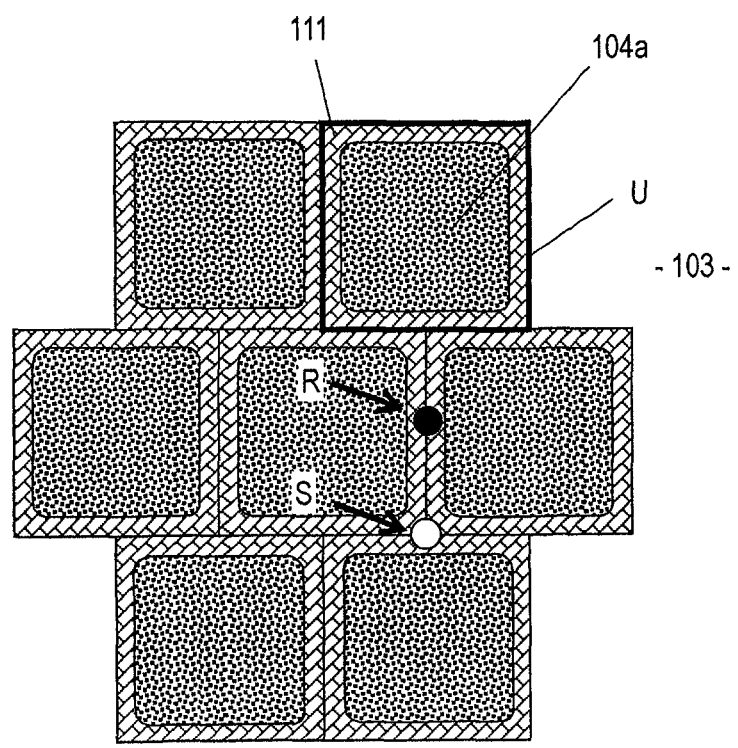
FIG. 11 is a plan view illustrating the structure of a conventional SiC power MOSFET.

FIG. 11 illustrates an exemplary arrangement of unit cells U when the drift layer 103 is viewed perpendicularly to its surface (i.e., upper surface) in the thickness direction thereof. In FIG. 11, the unit cells are arranged in a hound's-tooth check. In this case, if the dopant concentrations in the JFET regions 111 are increased uniformly, the most intense electric field will be applied to the point S, not the point R, on the gate insulating film. This is because if the unit cell U is a polygon when viewed perpendicularly to the surface of the drift layer 103, then the distance from each well 104a will be the longest at one of the vertices of the polygon, and the electric field intensity becomes the highest for the reason described above.

When the SiC power MOSFET is in OFF state, the most intense electric field that could be applied to the pn junction of SiC crystals would usually be about 2 MV/cm. In that case, however, the electric field to be applied to the gate insulating film would be approximately 3 MV/cm. And at a vertex of the unit cell, in particular, even this design value would be exceeded. For that reason, considering the long-term reliability, such a design is not preferred. This is a problem that has never been encountered in any Si power MOSFET, in which the maximum intensity of the electric field is one digit smaller than in such a SiC power MOSFET.

The present inventors carried out experiments to find the best dopant concentration in the JFET region 111 at which the intensity of the electric field applied to the point S on the gate insulating film shown in FIG. 11 satisfied the condition of reliability on the supposition that the dopant concentration in the JFET region 111 was uniform for the reasons described above. As a result, we discovered that to ensure such long-term reliability, the dopant concentration in the JFET region 111 should be lower than what is recommended by Patent Document No. 1. We also noticed that at such a concentration, the JFET resistance could not be reduced as originally intended. We further discovered that to reduce the ON-state resistance in such a situation, the interval L between the wells 104a should be increased, thus making it difficult to reduce the size of the unit cells and increase the current density of the SiC power MOSFET.

Based on these discoveries, the present inventors invented a SiC power MOSFET with a novel structure to be described in detail below.

Embodiment 1

Figure 1:
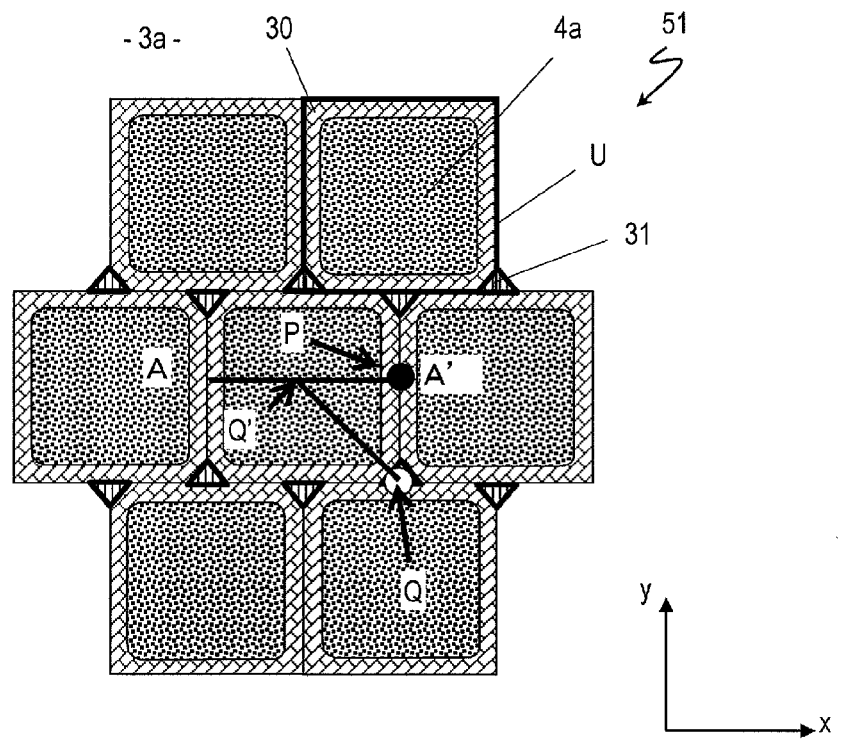
FIG. 1 is a plan view illustrating a first preferred embodiment of a SiC power MOSFET according to the present invention.

Hereinafter, a first specific preferred embodiment of a semiconductor device according to the present invention will be described. FIG. 1 is a plan view illustrating the structure of a SiC power MOSFET 51 as the first preferred embodiment of the present invention. Specifically, what is shown in FIG. 1 is the structure of the drift layer 3a as viewed perpendicularly to the surface (i.e., upper surface) of the drift layer 3a as will be described in detail later. The SiC power MOSFET 51 includes a number of unit cells U. In this preferred embodiment, the unit cells U have a square shape and are arranged in a hound's-tooth check as viewed perpendicularly to the drift layer 3a. More specifically, when arranged in the y direction, the unit cells U are shifted from each other by a half period. In FIG. 1, seven unit cells U are illustrated. If the unit cells U have such a square shape as viewed perpendicularly to the surface of the drift layer 3a, then the unit cells can be arranged in a shifted checkerboard pattern more densely with no gap left between them.

It should be noted that the "unit cell" is the smallest structural unit of that huge number of cells with the same structure. Also, if the unit cells are arranged in a checkerboard pattern, then the shape of each of those unit cells will be defined to be a region surrounded with a number of straight lines, each of which passes the midpoint of a line segment that connects together the respective centers of its associated unit cell and its adjacent unit cell and which crosses that line segment at right angles when viewed perpendicularly to the surface of the drift layer 3a. The unit cells that are arranged in a hound's-tooth check as shown in FIG. 11 can be regarded as being obtained by shifting the unit cells that are arranged in a checkerboard pattern.

The shape of the unit cells that has been defined as described above is a geometric one to be determined by the layout of the unit cells. That is why in an actual SiC power MOSFET 51, there are no physical structures on the boundaries or vertices that define the shape of those unit cells on the surface of the drift layer 3a. Still, the locations of those boundaries and vertices that define the shape of those unit cells can be determined unequivocally as described above.

Figure 2A:
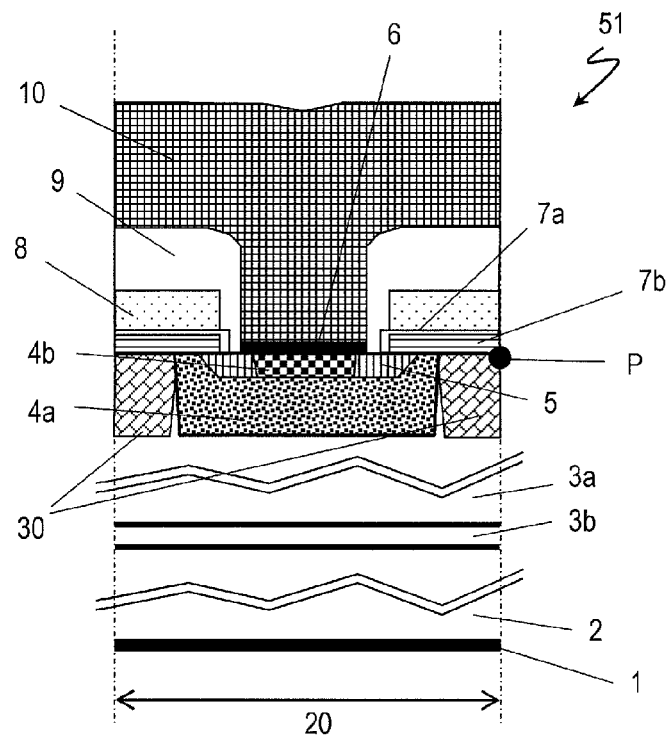
FIG. 2A is a cross-sectional view thereof as viewed on the plane A-A' shown in FIG. 1.
Figure 2B:
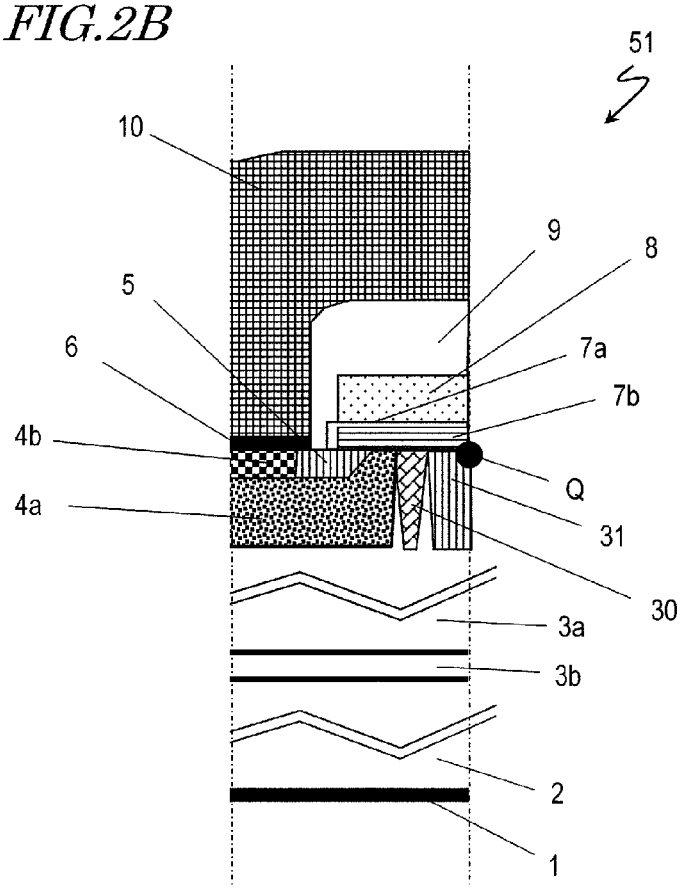
FIG. 2B is a cross-sectional view thereof as viewed on the plane Q-Q' shown in FIG. 1.

FIGS. 2A and 2B illustrate cross-sectional structures of each unit cell as viewed on the respective planes A-A' and Q-Q' shown in FIG. 1.

Hereinafter, the structure of the unit cell U will be described in detail. The unit cell U includes a substrate 2, which is made mostly of a wide-bandgap semiconductor, and a drift layer 3a, which is also made of the wide-bandgap semiconductor and arranged on the substrate 2. Each of the substrate 2 and the drift layer 3a may include a dopant. As used herein, the "wide-bandgap semiconductor" refers herein to a compound semiconductor such as SiC, GaN, diamond, BN or GaAs. Specifically, in this preferred embodiment, the substrate 2 is a SiC substrate with low resistivity, which may be doped with an n-type dopant (such as nitrogen, phosphorus, or arsenic) at a dose of $1\times10^{18}$ cm$^{-3}$ or more. On the other hand, the drift layer 3a is a SiC layer doped with an n-type dopant (such as nitrogen) at a dose of about $1\times10^{15}$ cm$^{-3}$ to about $1\times10^{16}$ cm$^{-3}$. Also, in this preferred embodiment, a buffer layer 3b doped with an n-type dopant at a dose of about $10^{17}$ cm$^{-3}$ to about $10^{18}$ cm$^{-3}$ is sandwiched between the drift layer 3a and the substrate 2. The drift layer 3a and the buffer layer 3b may be epitaxially grown on the substrate 2 by CVD process, for example.

A p-type well 4a has been defined in a part of the drift layer 3a so as to spread inward from its surface (i.e., go deeper into the substrate). The well 4a may be doped with a p-type dopant at a dose of $5\times10^{17}$ cm$^{-3}$ to of $1\times10^{19}$ cm$^{-3}$, for example.

In addition, a p$^+$-type contact region 4b and a source region 5, which is a first n-type doped region, have also been defined in the well 4a so as to spread inward from the surface of the well 4a. The p$^+$-type contact region 4b is doped with a p-type dopant at a dose of approximately $5\times10^{19}$ cm$^{-3}$ and the source region 5 is doped with an n-type dopant at a dose of $1\times10^{19}$ cm$^{-3}$ to $1\times10^{20}$ cm$^{-3}$.

A JFET region 30 has been defined as a second n-type doped region in the drift layer 3a and arranged between its own well 4a and the well 4a of an adjacent unit cell U. The dopant concentration is higher in the JFET region 30 than in the drift layer 3a. Specifically, the JFET region 30 is doped with an n-type dopant at a dose of $1\times10^{16}$ cm$^{-3}$ to $5\times10^{17}$ cm$^{-3}$. Furthermore, as shown in FIGS. 1 and 2B, a lightly doped region 31 has been defined as a third n-type doped region in the drift layer 3a, and arranged adjacent to the JFET region 30 so as to cover one of the vertices of the unit cell U when viewed perpendicularly to the surface of the drift layer 3a. As described above, there is no physical structure that indicates those vertices of the unit cell U in this SiC power MOSFET 51. However, once the layout of the unit cell U has been determined, the locations of those vertices are also determined automatically and the lightly doped region 31 is defined so as to cover those vertices.

It is preferred that the lightly doped region 31 be either approximately as deep as, or about 10% deeper than, the well 4a. Generally speaking, when a well is defined by ion implantation process, the variation in the depth direction will be approximately 5% with a margin included. That is why if the light doped region 31 is designed to be approximately 10% deeper than the well 4a, then the light doped region 31 will never fail to be at least roughly as deep as the well 4a. The lightly doped region 31 may have been doped with an n-type dopant at a dose of approximately $1\times10^{16}$ cm$^{-3}$. As will be described in detail later, the dopant concentration is preferably lower in the lightly doped region 31 than in the JFET region 30. Nevertheless, the dopant concentration in the lightly doped region 31 is not particularly defined with respect to, and may be either higher or lower than, the one in the drift layer 3a. Still alternatively, the dopant concentrations in the lightly doped region 31 and in the drift layer 3a may even be almost equal to each other.

The well 4a, the contact region 4b, the source region 5, the JFET region 30 and the lightly doped region 31 may be defined in the drift layer 3a by performing respective ion implantation process steps.

In this preferred embodiment, to provide a channel with low resistivity, each unit cell has a channel layer 7b, which covers at least partially the JFET region 30, the well 4a and the source region 5 and which is doped with an n-type dopant at a dose of $1\times10^{15}$ cm$^{-3}$ to $1\times10^{16}$ cm$^{-3}$. The channel layer 7b is made of SiC, and has been epitaxially grown to a thickness of approximately 50-200 nm by CVD process. In this case, the gate voltage may have a threshold value of 3 to 6 V. Optionally, to control the threshold value, dopant ions may be implanted into the surface of the well 4a that contacts with the channel layer 7b. However, the channel layer 7b does not always have to be provided. Instead, a channel may be defined by an inversion layer near the surface of the well 4a as in a normal MOSFET.

Furthermore, a gate insulating film 7a either covers the channel layer 7b entirely or covers at least partially the JFET region 30, the well 4a, and the source region 5. Also, a gate electrode 8 is arranged on the gate insulating film 7a. The gate insulating film 7a may be made of silicon dioxide, for example, and may be formed by either depositing and then patterning silicon dioxide or thermally oxidizing and then patterning the surface of the drift layer 3a or the channel layer 7b. The gate electrode 8 may be made of polysilicon, for example.

A source electrode 6 is arranged so as to be electrically coupled to the source region 5 and the contact region 4b. Also, a drain electrode 1 is further arranged on the other side of the substrate 2 on which the drift layer 3a is not provided. The source electrode 6 and the drain electrode 1 may be made of a Ni alloy and make ohmic contact with the source region 5, the contact region 4b and the substrate 2 as a result of heat treatment.

Furthermore, an interlevel dielectric film 9 has been deposited over the gate electrode 8 and a contact hole has been cut through the interlevel dielectric film 9 to expose the source electrode 6. Through the contact, the source electrode 6 is electrically connected to a source line 10, to which also connected are the respective source electrodes 9 of other unit cells.

One of the major features of this SiC power MOSFET 51 is that the MOSFET 51 includes the lightly doped region 31, which may be formed by ion implantation process as described above. Specifically, to define the lightly doped region 31, after the drift layer 3a has been formed, an ion implantation process is carried out with the surface of the drift layer 3a selectively covered with a mask that defines the lightly doped region 31 just like when the well 4a, the contact region 4b, the source region 5 and the JFET region 30 are defined. The other structures can be formed by conventional semiconductor device processing technologies.

Alternatively, after the well 4a, the contact region 4b and the source region 5 have been defined in the drift layer 3a by ion implantation, the JFET region 30 may be defined in a different part of the drift layer 3a other than the well 4a so that the rest of the drift layer 3a except the well 4a and the JFET region 30 may be used as the lightly doped region 31. In that case, the dopant concentration in the lightly doped region 31 will be as high as in the drift layer 3a.

In each unit cell of the SiC power MOSFET 51, when a bias voltage that is equal to or higher than a threshold voltage is applied to the gate electrode 8 with a predetermined voltage applied between the source electrode 6 and the drain electrode 1, electrons will be injected from the source line 10 into the channel layer 7b by way of the source electrode 6 and the source region 5 and then move from the channel layer 7b to the drain electrode 1 by way of the JFET region 30, the drift region 3a and the substrate 2. In this manner, each unit cell of the SiC power MOSFET 51 is turned ON. Although not shown in FIG. 1, the gate electrode 8 and the drain electrode 1 of each unit cell are continuous with their counterparts of the other unit cells. That is why all unit cells of the SiC power MOSFET 51 operate at the same time.

Next, the lightly doped region 31 will be described in detail. In conventional SiC power MOSFETs, the entire JFET region between two adjacent wells is uniformly doped with a dopant in a constant concentration. In the SiC power MOSFET 51 of this preferred embodiment, on the other hand, the lightly doped region 31, which has a lower dopant concentration than the JFET region 30, is defined in the drift layer 3a and arranged adjacent to the JFET region 30 so as to cover one of the vertices of the unit cell U as viewed perpendicularly to the surface of the drift layer 3a.

The dopant concentration of the lightly doped region 31 is determined by the dopant concentrations in the well 4a and the JFET region 30 and by the interval between the wells 4a. Specifically, the well 4a ordinarily has a concentration of $5 \times 10^{17}$ cm$^{-3}$ to $2 \times 10^{18}$ cm$^{-3}$. By setting the concentration of the well 4a within this range, when a positive high voltage is applied to the drain electrode 1 in the OFF state (i.e., when a voltage with such a polarity as to maintain a high breakdown voltage is applied to the drain electrode 1), it is possible to prevent the expanding depletion layer from reaching the well region and causing a punch-though short circuit with the source region 5. Compared to a Si power device, this concentration in the well is relatively high. As used herein, "to apply a high voltage to the drain electrode 1" means keeping the potential level at the drain electrode 1 relatively high with respect to either the source electrode 6 or the gate electrode 8.

Considering the constraint to be imposed when the mask is formed, the interval L between the wells 4a is preferably at least one equal to 0.5 μm, and preferably falls within the range of 0.8 μm to 1.5 μm in practice. In that case, it is preferred that the dopant concentration in the JFET region 30 fall within the range of $1 \times 10^{16}$ cm$^{-3}$ to $5 \times 10^{17}$ cm$^{-3}$. However, if the interval L between the wells 4a can be kept at 0.5 μm with good reproducibility, the dopant concentration in the JFET region 30 may exceed $5 \times 10^{17}$ cm$^{-3}$ and could even be $8 \times 10^{17}$ cm$^{-3}$, for example. In that case, even if a high voltage is applied to the drain electrode in the OFF state, the depletion layer would quickly finish expanding within the JFET region 30 between the wells 4a. That is why this design will work fine with no problem at all.

Nonetheless, the interval L between the wells 4a is preferably defined to be approximately 1 μm when the SiC power MOSFET 51 is fabricated using an i-line stepper. For that reason, in that case, the dopant concentration in the JFET region 30 is preferably defined so as to fall within the range of $1 \times 10^{16}$ cm$^{-3}$ to $5 \times 10^{16}$ cm$^{-3}$.

The dopant concentration in the lightly doped region 31 is defined to be lower than in the JFET region 30. Preferably, when a voltage is applied to the drain electrode, the dopant concentration of the lightly doped region 31 is set so that the lightly doped region 31 starts to be depleted before the JFET region 30 gets depleted completely. For example, in a situation where the unit cells are arranged in a hound's-tooth check, where the dopant concentrations in the well 4a and the JFET region 30 are determined as described above, and where the interval L between the wells 4a is defined as described above, the depletion layer expanding to deplete the lightly doped region 31 at the vertex Q of the unit cell should be approximately 1.4 times as long as in a situation where the JFET region 30 gets depleted at the point P as shown in FIG. 1. For that purpose, the dopant concentration at that vertex of the unit cell U may be approximately a half or less as high as in the JFET region 30. If the JFET region 30 has a dopant concentration of $2.5 \times 10^{16}$ cm$^{-3}$, then the lightly doped region 31 may have a dopant concentration of approximately $1 \times 10^{16}$ cm$^{-3}$. In that case, the lightly doped region 31 can start to be depleted before the JFET region 30 gets depleted completely.

As a result, the intensity of the electric field applied to the point Q on the gate insulating film 7a and the JFET region 30 in the OFF state can be reduced without sacrificing the channel resistance or the JFET resistance in the ON state. Naturally, the lightly doped region 31 may also have a lower dopant concentration of $1 \times 10^{15}$ cm$^{-3}$, for example. In that case, however, there would be a region where no current flows near the vertex of the unit cell and the ON-state characteristic would be sacrificed. For that reason, depending on whether increase in the reliability of the unit cell or reduction in the ON-state resistance should be given a higher priority, the concentration in the lightly doped region 31 may be determined. In any case, when the hound's-tooth check is adopted, it is preferred that the dopant concentration in the lightly doped region 31 be a half or less as high as in the JFET region 30.

Figure 3:
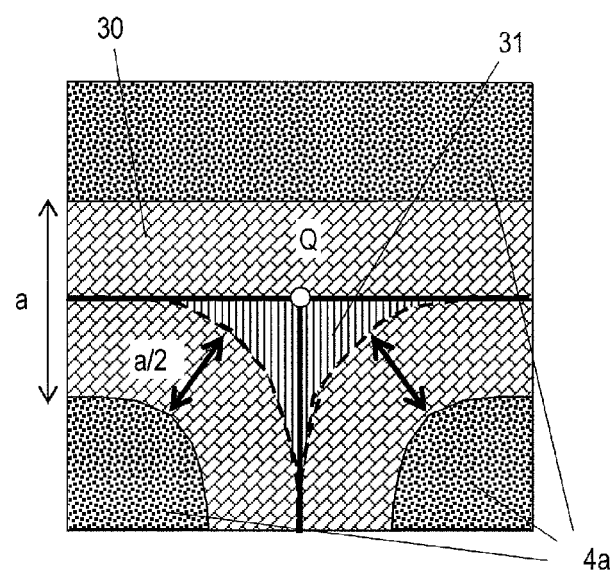
FIG. 3 is a schematic representation illustrating, on a larger scale, the structure of each unit cell of the SiC power MOSFET of the first preferred embodiment around a vertex thereof.

FIG. 3 illustrates the vertex Q of the unit cell U and its surrounding portions on a larger scale. Supposing the shortest interval between that well 4a and the well 4a of an adjacent unit cell is represented by "a", the lightly doped region 31 is preferably located at a distance of more than a/2 from the outer periphery of the former well 4a. If the location of the lightly doped region 31 satisfies such a relation and if the dopant concentration in the light doped region 31 is lower than in the JFET region, the maximum electric field intensity at the point Q in SiC and in the gate insulating film can be reduced even when a high voltage is applied to the drain electrode in the OFF state.

As a result, even if a high voltage is applied to the drain electrode in the OFF state, the intensity of the electric field in the insulating film and the drain electric field at and around the vertex of the unit cell U can still be reduced. Consequently, the amount of drain leakage current to flow can be reduced significantly and the variation in breakdown voltage between respective unit cells can be minimized. On top of that, since the intensity of the electric field applied to the gate insulating film 7a at the vertex Q of the unit cell U also decreases, an even higher degree of reliability is realized for the gate insulating film.

In FIG. 3, the minimum area of the lightly doped region 31 is illustrated. And even if the actual area of the lightly doped region 31 is somewhat larger than the one shown in FIG. 3, the same effect will still be achieved. For example, even if the planar shape of the lightly doped region is approximated to be a triangle defined by connecting together the respective vertices shown in FIG. 3, a similar effect will also be achieved.

Thus, according to the present invention, the dopant concentration in the JFET region 30 is higher than in the drift layer 4a. As a result, the expansion of the depletion layer in the JFET region 30 can be minimized and the JFET resistance can be reduced. Consequently, the interval between the wells 4a can be shortened and the size of each unit cell can be reduced. That is to say, the current density can be increased with the ON-state resistance reduced.

On the other hand, at each vertex of every unit cell, there is a lightly doped region 31, which has a lower dopant concentration than the JFET region 30. The distance between two adjacent wells is longer in the direction in which there is a vertex of one of the two unit cells than in any other direction, and therefore, the lightly doped region is not easily affected by the JFET resistance. Particularly, the depletion layer will expand from the boundary between the wells and the JFET region. That is why if the dopant concentration in the JFET region is increased to reduce the JFET resistance in the other regions, the increase in resistance due to the expansion of the depletion layer has little impact in the vicinity of the vertex of the unit cell that is located between the wells. Consequently, even if the lightly doped region 31 is provided, the JFET resistance will not increase in the ON state.

In the OFF state, on the other hand, the lightly doped region 31 with a low dopant concentration will be in the vicinity of one of the vertices of a unit cell, which is located between two adjacent wells and which will not be easily affected by the increase in resistance even when the depletion layer expands. For that reason, in a portion of the gate insulating film to which the most intense electric field is applied in the OFF state, that high electric field intensity can be reduced effectively. As a result, the drain leakage current can be minimized in the OFF state, the variation in breakdown voltage between unit cells can be reduced significantly, and the reliability of the gate insulating film can be increased.

In the preferred embodiment described above, each unit cell of the SiC power MOSFET 51 is supposed to have the channel layer 7b. However, each unit cell may also have an inversion layer that has been produced near the surface of the well 4a so as to function as a channel and a gate insulating film, which has been formed by thermally oxidizing the surface of the drift layer 3a.

No matter whether the channel layer 7b is provided or not and no matter how the gate insulating film is formed, a portion of the gate insulating film, which is located right over the lightly doped region 31, has improved film quality because the lightly doped region 31 has a lower dopant concentration than any other doped region. This is probably because the lightly doped region 31 has such a low dopant concentration as to have a significantly decreased number of crystal imperfections in itself and have much less harmful electrical influence on the channel layer or the gate insulating film that is located right over the lightly doped region 31.

That is why by providing the lightly doped region 31, not only can the intensity of the electric field applied to the gate insulating film at the vertex Q of the unit cell be reduced in both the ON and OFF states but also can the breakdown voltage of the gate insulating film itself be increased in the vicinity of the vertex Q. As a result, the breakdown voltage of the SiC power MOSFET can be further increased and an even higher degree of reliability can be achieved. By reducing the dopant concentration in the semiconductor layer in this manner, the breakdown voltage of an oxide film, which is produced by oxidizing a semiconductor, can be increased particularly significantly if the dopant concentration is less than $1 \times 10^{17}$ cm$^{-3}$.

That is why if the dopant concentration in the lightly doped region 31 is set to be less than $1 \times 10^{17}$ cm$^{-3}$, not just the effects described above but also an increase in breakdown voltage thanks to quality improvement of the gate insulating film can be achieved as well.

Embodiment 2

Figure 4:
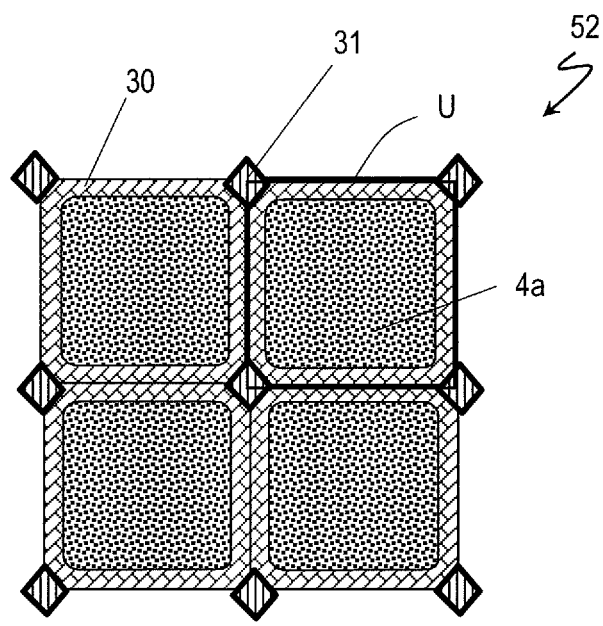
FIG. 4 is a plan view illustrating a second preferred embodiment of a SiC power MOSFET according to the present invention.

FIG. 4 is a plan view illustrating a second specific preferred embodiment of a SiC power MOSFET according to the present invention. The SiC power MOSFET 52 shown in FIG. 4 includes a number of unit cells U, each having the same structure as the first preferred embodiment described above. In this second preferred embodiment, however, when viewed perpendicularly to the surface of the drift layer 3a, the unit cells U are arranged in a checkerboard pattern, not in the hound's-tooth check, which is a difference from the first preferred embodiment.

As in the first preferred embodiment described above, when viewed perpendicularly to the surface of the drift layer 3a, each well 4a is surrounded with the JFET region 30. But in this preferred embodiment, the lightly doped region 31 is located where four adjacent unit cells U share their vertices with each other. According to such a layout, the cells are arranged symmetrically with respect to that point where the four adjacent unit cells U share their vertices with each other. That is why the device can be designed easily and such a layout will contribute to stabilizing the operation of the device.

As in the first preferred embodiment described above, the SiC power MOSFET 52 of this preferred embodiment also has the lightly doped region 31, and therefore, can reduce the concentration of the electric field due to the application of a voltage to the drain electrode in the OFF state. As a result, a SiC power MOSFET with further stabilized OFF state characteristic is realized. In addition, when viewed perpendicularly to the surface of the drift layer 3a, each unit cell also has a square shape as in the first preferred embodiment described above. Consequently, the unit cells can be arranged in a checkerboard pattern without leaving any gap between themselves and the density of the unit cells can be increased.

Embodiment 3

Figure 5:
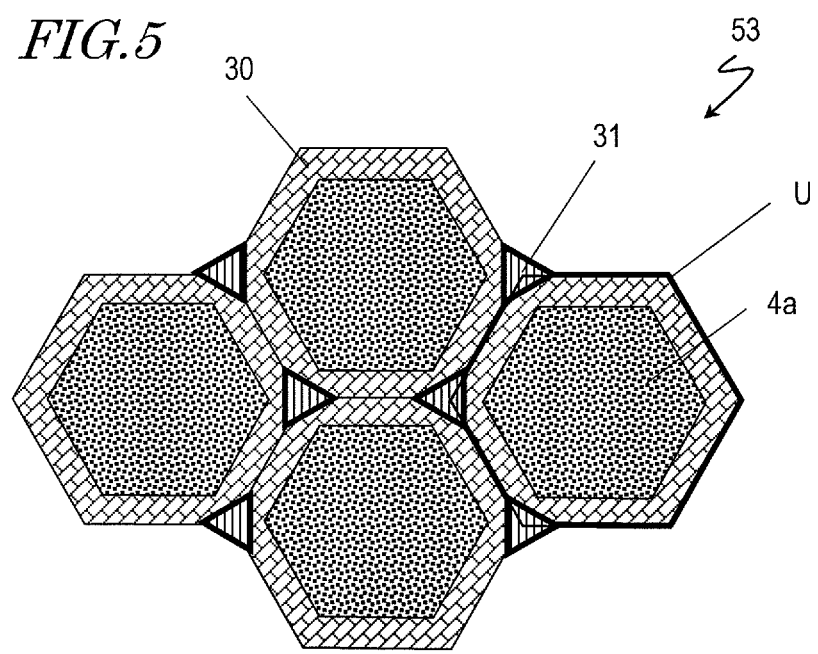
FIG. 5 is a plan view illustrating a third preferred embodiment of a SiC power MOSFET according to the present invention.

FIG. 5 is a plan view illustrating a third specific preferred embodiment of a SiC power MOSFET according to the present invention. The SiC power MOSFET 53 shown in FIG. 5 includes a number of unit cells U, each having the same structure as the first preferred embodiment described above. In this third preferred embodiment, however, when viewed perpendicularly to the surface of the drift layer 3a, each unit cell U has a hexagonal shape, which is a difference from the first preferred embodiment.

As in the first preferred embodiment described above, when viewed perpendicularly to the surface of the drift layer 3a, each well 4a is surrounded with the JFET region 30. But in this preferred embodiment, the lightly doped region 31 is located where three adjacent unit cells U share their vertices with each other. According to such a layout, the cells are arranged symmetrically with respect to that point where the three adjacent unit cells U share their vertices with each other. That is why the device can be designed easily and such a layout will contribute to stabilizing the operation of the device.

As in the first preferred embodiment described above, the SiC power MOSFET 53 of this preferred embodiment also has the lightly doped region 31, and therefore, can reduce the concentration of the electric field due to the application of a voltage to the drain electrode in the OFF state. As a result, a SiC power MOSFET with further stabilized OFF state characteristic is realized.

Embodiment 4

Figure 6:
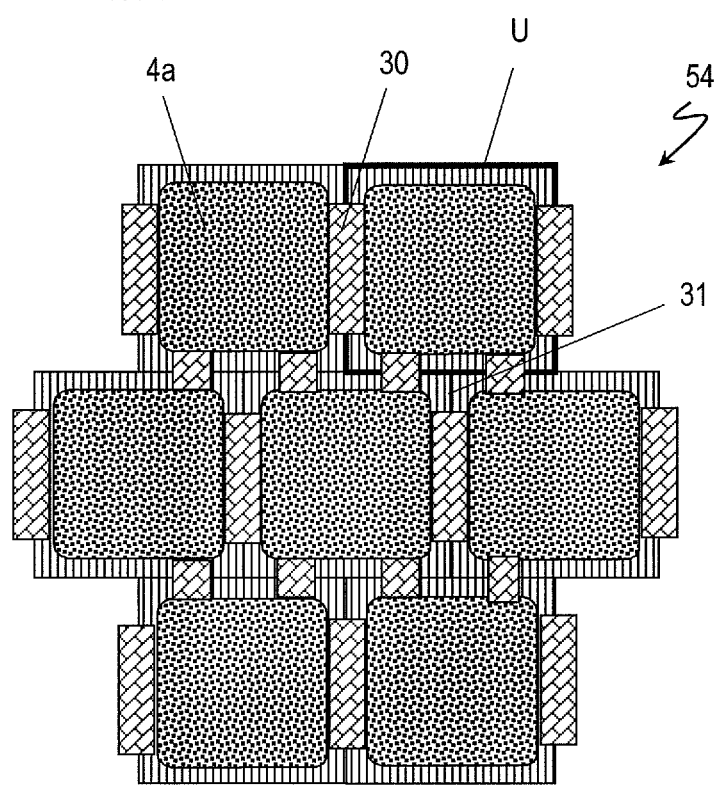
FIG. 6 is a plan view illustrating a fourth preferred embodiment of a SiC power MOSFET according to the present invention.

FIG. 6 is a plan view illustrating a fourth specific preferred embodiment of a SiC power MOSFET according to the present invention. The SiC power MOSFET 54 shown in FIG. 6 also has a number of unit cells U, each having the same structure as the first preferred embodiment described above. In the example illustrated in FIG. 6, each unit cell U has a square shape when viewed perpendicularly to the surface of the drift layer 3a. However, the unit cells U just need to have a polygonal shape and are not necessarily square. Also, the unit cells U may also be arranged in a hound's-tooth check, a checkerboard pattern or any other arbitrary pattern as long as that pattern has some periodicity.

As in the first preferred embodiment described above, each unit cell U also has a well 4a. In this preferred embodiment, however, the JFET region does not surround the well 4a entirely but is provided only in a region that is located closest to the well 4a of an adjacent unit cell U. And the lightly doped region 31 is defined elsewhere. More specifically, when viewed perpendicularly to the surface of the drift layer 3a, the JFET region 30 is arranged adjacent to the well 4a only where the boundary that defines the well 4a of each unit cell U is substantially parallel to the boundary that defines the counterpart 4a of one of its adjacent unit cells U. This is a region where the interval between the two adjacent wells 4a is the shortest. On the other hand, the lightly doped region 31 covers a different part of the gap between the adjacent wells 4a of the unit cells U other than the JFET region 30. As the lightly doped region 31 is arranged in the relatively wide gap between the wells 4a, the lightly doped region 31 accounts for a greater percentage than any of the first to third preferred embodiments of the present invention described above. That is why according to this preferred embodiment, when the SiC power MOSFET 54 is OFF, the intensity of the electric field generated by the voltage applied to the drain can be further reduced.

It should be noted that the lightly doped region 31 does not have to have the shape shown in FIG. 6. Instead, lightly doped regions 31 with various shapes and sizes may be provided as well. In that case, the best shape varies depending on whether the ON-state resistance or the drain breakdown voltage, between which a tradeoff usually has to be made, is the electrical characteristic that should be given the higher priority.

In the first through fourth preferred embodiments of the present invention described above, the present invention has been described as being applied to a SiC power MOSFET. However, as long as the semiconductor device is made of a wide-bandgap semiconductor, the MOSFET may also be made of another compound semiconductor such as GaN, for example. Even so, the effects of the present invention described above can also be achieved.

Also, in the first through fourth preferred embodiments of the present invention described above, when viewed perpendicularly to the surface of the drift layer 3a, the unit cells U are supposed to be square or hexagonal. However, the unit cells U may also have any other polygonal shape. Furthermore, in the preferred embodiments described above, the unit cells U are supposed to be arranged two-dimensionally. But the same effects as what has already been described for those preferred embodiments can also be achieved if the unit cells U are arranged at least one-dimensionally. Furthermore, when viewed perpendicularly to the surface of the drift layer 3a, the respective vertices of each polygonal unit cell U do not always have to be acute but may also be somewhat round.

INDUSTRIAL APPLICABILITY

The present invention can be used effectively to make either a power MOSFET itself or various kinds of controllers and drivers using the power MOSFETs.

REFERENCE SIGNS LIST

1, 101 drain electrode
2, 102 substrate
3a, 103 drift layer
3b buffer layer
4a, 104a well
4b contact region
5, 105 source region
6, 106 source electrode
7a, 107 gate insulating film 7b channel layer
8, 108 gate electrode
9 interlevel dielectric film
10 source line
30 JFET region
31 lightly doped region
51, 52, 53, 54 semiconductor device

The invention claimed is:

1. A semiconductor device with multiple unit cells that are arranged either one-dimensionally or multi-dimensionally, each said unit cell comprising:
    a substrate, which is made of a wide-bandgap semiconductor;
    an n-type drift layer, which is arranged on the substrate and which is made of the wide-bandgap semiconductor;
    a p-type well, which is defined in the drift layer;
    a first n-type doped region, which is defined in the well;
    a source electrode, which is electrically connected to the first n-type doped region;
    a second n-type doped region, which is defined in the drift layer so as to be adjacent to its own well and arranged between its own well and an adjacent unit cell's well and which has a higher dopant concentration than the drift layer;
    a gate insulating film, which covers at least partially the first and second n-type doped regions and the well;
    a gate electrode, which is arranged on the gate insulating film; and
    a third n-type doped region, which is defined in the drift layer and arranged adjacent to the second n-type doped region in a direction perpendicular to a thickness direction of the drift layer so as to cover one of the vertices of the unit cell when the drift layer is viewed perpendicularly to the surface of the drift layer in the thickness direction thereof and which has a lower dopant concentration than the second n-type doped region, and
    wherein the second n-type doped region is in contact with both of its own well and the adjacent unit cell's well at a region where the third n-type doped region does not exist.

2. The semiconductor device of claim 1, wherein each said unit cell further includes a drain electrode, which is arranged on the other side of the substrate opposite to the drift layer, and
    wherein a voltage with such a polarity as to maintain a high breakdown voltage is applied to the drain electrode, and
    wherein the dopant concentration of the third n-type doped region is defined so that the third n-type doped region starts to be depleted before the second n-type doped region gets depleted completely.

3. The semiconductor device of claim 1, wherein if the minimum interval between the well of each said unit cell and the well of the adjacent unit cell is a, then the third n-type doped region is located at a distance exceeding a/2 from the outer periphery of the former well.

4. The semiconductor device of claim 1, wherein the unit cells are arranged two-dimensionally.

5. The semiconductor device of claim 4, wherein if the drift layer is viewed perpendicularly to its surface in the thickness direction thereof, those unit cells have a square shape and are arranged in a hound's-tooth check.

6. The semiconductor device of claim 5, wherein if the drift layer is viewed perpendicularly to its surface in the thickness direction thereof, the second n-type doped region is arranged adjacent to the well only where the boundaries defining the respective wells of each said unit cell and its adjacent unit cell are substantially parallel to each other, and the third n-type doped region is arranged so as to fill a different part of the gap between the wells of the two adjacent unit cells other than the second n-type doped regions.

7. The semiconductor device of claim 4, wherein if the drift layer is viewed perpendicularly to its surface in the thickness direction thereof, those unit cells have a square shape and are arranged in a checkerboard pattern.

8. The semiconductor device of claim 4, wherein if the drift layer is viewed perpendicularly to its surface in the thickness direction thereof, those unit cells have a hexagonal shape and are arranged so that three adjacent unit cells share their vertices with each other.

9. The semiconductor device of claim 1, wherein each said unit cell further includes a channel layer, which is arranged under the gate insulating film so as to cover at least partially the first and second n-type doped regions and the well.

10. The semiconductor device of claim 1, wherein the wide-bandgap semiconductor is SiC.

11. The semiconductor device of claim 1, wherein the third n-type doped region has a dopant concentration that is less than $1 \times 10^{17}$ cm$^{-3}$.

12. The semiconductor device of claim 1, wherein the second n-type doped region is arranged where the interval between the two adjacent wells is the shortest.

13. The semiconductor device of claim 1, wherein if the drift layer is viewed perpendicularly to its surface in the thickness direction thereof, each of the unit cells has a polygonal shape, at least a portion of the second n-type doped region is located at a region where the third n-type doped region does not exist and where a side of the each unit cell overlaps with a side of the unit cell that is adjacent to the each unit cell.

14. The semiconductor device of claim 13, wherein at least a portion of the third-n-type doped region is arranged at a region where a vertex of the each unit cell overlaps with a vertex of the unit cell that is adjacent to the each unit cell.

* * * * *